(12) United States Patent
Takemoto et al.

(10) Patent No.: US 8,058,803 B2
(45) Date of Patent: Nov. 15, 2011

(54) ORGANIC ELECTROLUMINESCENCE DISPLAY DEVICE

(75) Inventors: Issei Takemoto, Hiratsuka (JP); Nobuhiko Fukuoka, Ebina (JP); Hitoshi Azuma, Yokohama (JP)

(73) Assignee: Hitachi Displays, Ltd., Chiba (JP)

( * ) Notice: Subject to any disclaimer, the term of this patent is extended or adjusted under 35 U.S.C. 154(b) by 163 days.

(21) Appl. No.: 12/219,982

(22) Filed: Jul. 31, 2008

(65) Prior Publication Data

US 2009/0072736 A1    Mar. 19, 2009

(30) Foreign Application Priority Data

Aug. 2, 2007  (JP) .................................. 2007-201407

(51) Int. Cl.
*H01J 17/24* (2006.01)
(52) U.S. Cl. ........................................ 313/554; 313/512
(58) Field of Classification Search .................. 313/512, 313/549, 504–506, 553–561, 546; 257/682, 257/913, E23.137
See application file for complete search history.

(56) References Cited

U.S. PATENT DOCUMENTS

| | | | |
|---|---|---|---|
| 2003/0230978 A1 | 12/2003 | Hishida | |
| 2004/0092197 A1* | 5/2004 | Wei et al. | 445/50 |
| 2005/0269926 A1 | 12/2005 | Fukuoka et al. | |
| 2006/0138952 A1 | 6/2006 | Yamaguchi | |
| 2008/0143248 A1* | 6/2008 | Endo et al. | 313/504 |

FOREIGN PATENT DOCUMENTS

| | | |
|---|---|---|
| CN | 1703123 A | 5/2005 |
| CN | 1801480 A | 12/2005 |
| JP | 2004-006286 | 3/2003 |

OTHER PUBLICATIONS

Office Action from Chinese Patent Office dated Jun. 26, 2009, in Chinese.

* cited by examiner

*Primary Examiner* — Toan Ton
*Assistant Examiner* — Andrew Coughlin
(74) *Attorney, Agent, or Firm* — Stites & Harbison PLLC; Juan Carlos A. Marquez, Esq.

(57) ABSTRACT

Provided is an organic EL display device in which a large amount of a moisture absorbent is formed in a limited narrow region. An organic electroluminescence display device includes a rectangle element substrate having a display region; and a sealing substrate firmly adhered to the element substrate at a protrusion formed on the periphery thereof, in which a moisture absorbent is formed in a region of a concave surface surrounded by the protrusion so as not to overlap the display region, and the moisture absorbent includes moisture absorbents which are formed of a plurality of linear pattern set each joined to adjacent another moisture absorbents so as to be disposed in parallel with each other, and the crosssections of the moisture absorbents intersecting the longitudinal direction of the moisture absorbents are formed in the shape of a plurality of mounds joined to each other.

6 Claims, 6 Drawing Sheets

ORGANIC ELECTROLUMINESCENCE DISPLAY DEVICE

CROSS-REFERENCE TO RELATED APPLICATION

The present application claims priority from Japanese application JP 2007-201407 filed on Aug. 2, 2007, the content of which is hereby incorporated by reference into this application.

BACKGROUND OF THE INVENTION

1. Field of the Invention

The present invention relates to an organic electroluminescence display device (hereinafter sometimes referred to as an organic EL display device). More particularly, the present invention relates to an organic EL display device in which an element substrate having a display region with organic EL elements being arranged therein is sealed with a concave translucent sealing substrate.

2. Description of the Related Art

An organic EL display device of this kind has a structure in which light emitted from the organic EL elements of the display region is irradiated on an observer side through the sealing substrate, which is a so-called top emission structure.

In such a structure, an organic light-emitting layer may be disposed above wirings used for driving control of respective pixels (wirings such as a scanning signal line and data signal line). Therefore, there is no fear of forming a light shielding region due to the wiring, thereby being capable of increasing an aperture ratio of the respective pixels, which is suited for attaining higher definition.

In an organic EL display device having such a structure, when moisture enters the display region with the organic EL elements being arranged therein, characteristics of the organic EL elements are sometimes degraded, and a so-called dark spot (non-light-emitting portion) occurs in the display region.

Therefore, generally, by applying a moisture absorbent (desiccant) for absorbing the moisture on the concave surface of the sealing substrate, and by sealing the element substrate with the sealing substrate, space around the display region is made to be a low moisture concentration atmosphere to prevent the entry of the moisture into the organic EL elements.

As such a structure, for example, there is known a structure in which the moisture absorbent is applied in a linear pattern to a region of the concave surface of the sealing substrate which does not overlap the display region of the element substrate, that is, to a region which is outside the display region, so as to surround the display region (see Japanese Patent Application Laid-open No. 2004-6286).

However, in the above-mentioned organic EL display device, the moisture absorbent is applied in a linear pattern so as to surround the display region, the amount of the moisture absorbent is limited, there are cases in which the characteristics of the organic EL elements can not be sufficiently stabilized.

The above-mentioned Japanese Patent Application Laid-open No. 2004-6286 discloses that a moisture absorbent in a linear pattern runs around the display region in a spiral manner, and is wound multiple turns so as to be spaced from one another. By increasing the number of the turns of the wound moisture absorbent, the amount of the moisture absorbent may be increased accordingly.

However, in this case, the width of the region where the moisture absorbent is formed outside the display region has to be large, and a so-called frame (a region between an outer periphery of the display region and an outer periphery of the element substrate) of the display device has to be large.

In other words, the technology disclosed in the above-mentioned Japanese Patent Application Laid-open No. 2004-6286 is inappropriate for a case where a large amount of a moisture absorbent has to be formed in a limited narrow region.

SUMMARY OF THE INVENTION

It is an object of the present invention to provide an organic EL display device in which a large amount of a moisture absorbent is formed in a limited narrow region to achieve stabilization of characteristics of organic EL elements.

Representative aspects of the present invention disclosed in the present application are briefly described in the following.

(1) An organic electroluminescence display device according to the present invention includes:

a rectangle element substrate having a display region with a plurality of light-emitting elements being arranged therein; and a sealing substrate firmly adhered to the element substrate with a sealing material at a protrusion formed on the periphery thereof and opposed to the element substrate, in which a moisture absorbent is formed in a region of a concave surface surrounded by the protrusion of the sealing substrate so as not to overlap the display region, and the moisture absorbent includes moisture absorbents which are formed of a plurality of linear pattern set each joined to adjacent moisture absorbents so as to be disposed in parallel with each other, and the crosssections of the moisture absorbents intersecting the longitudinal direction of the moisture absorbents are formed in a shape of a plurality of mounds joined to each other.

(2) In an organic electroluminescence display device of the present invention, in the structure according to the aspect (1), the moisture absorbents which are formed of the plurality of linear pattern set each joined to adjacent moisture absorbents so as to be disposed in parallel with each other are formed by changing a direction of an extended portion of a moisture absorbent extending in one direction and then extending another moisture absorbent in a direction opposite to the one direction.

(3) In an organic electroluminescence display device of the present invention, in the structure according to the aspect (1), a driver circuit for driving the light-emitting elements is formed on the element substrate adjacent to the display region, and the moisture absorbents which are formed of the plurality of linear pattern set each joined to adjacent another moisture absorbents so as to be disposed in parallel with each other are formed so as to overlap at least a part of the driver circuit.

(4) In an organic electroluminescence display device of the present invention, in the structure according to the aspect (1), the moisture absorbent is formed so as to surround the display region and the driver circuit.

(5) In an organic electroluminescence display device of the present invention, in the structure according to the aspect (1), the moisture absorbents which are in the plurality of linear patterns each joined to adjacent moisture absorbents so as to be disposed in parallel with each other comprise a ring-like moisture absorbent formed so as to surround the display region.

(6) In an organic electroluminescence display device of the present invention, in the structure according to the aspect (5), the moisture absorbents other than the ring-like moisture absorbent formed so as to surround the display region are moisture absorbents disposed inside the ring-like moisture absorbent except corner portions of the ring-like moisture absorbent.

It is to be noted that the present invention is not limited to the above-mentioned structures, and various modifications are possible without departing from the technical idea of the present invention.

In an organic EL display device structured in this way, a large amount of a moisture absorbent may be formed in a limited narrow region to achieve stabilization of the characteristics of organic EL elements thereof.

DETAILED DESCRIPTION OF THE INVENTION

Embodiments according to an organic EL display device of the present invention are described in the following with reference to the accompanying drawings.

Embodiment 1

Figure 2A:
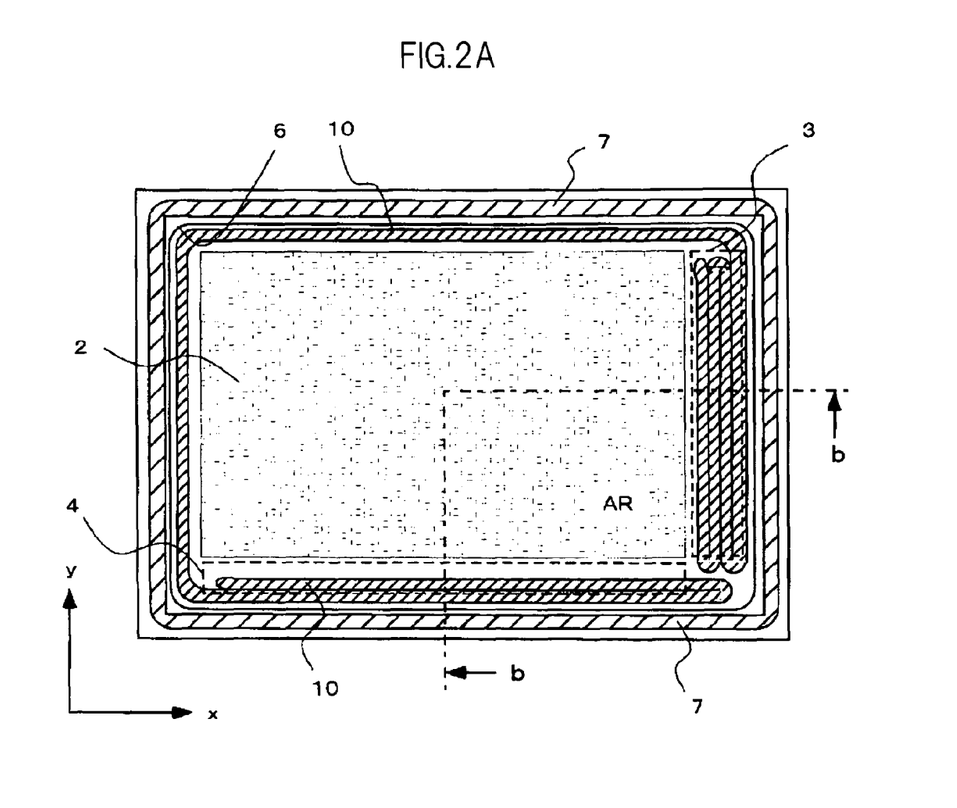
FIGS. 2A and 2B each are structural views illustrating the embodiment of the organic EL display device according to the present invention.
Figure 2B:
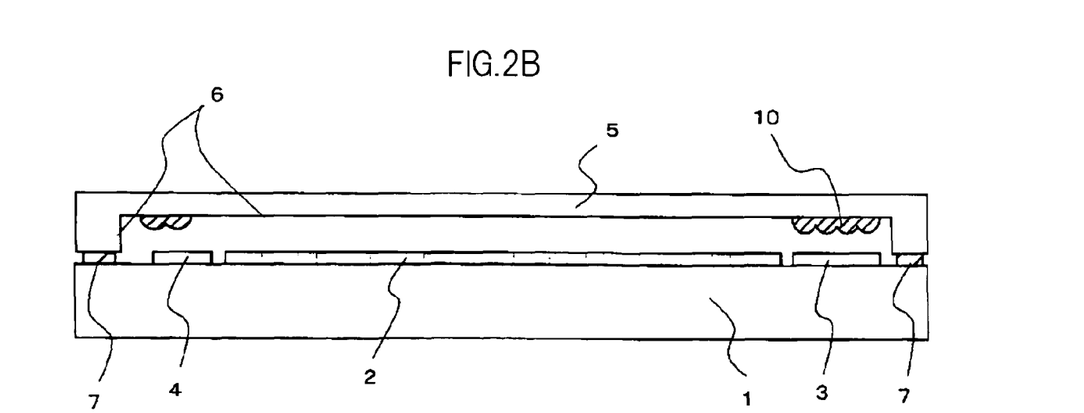

FIGS. 2A and 2B each illustrate an embodiment of an organic EL display device according to the present invention, and illustrate a structure of an organic EL display device having a structure referred to as, for example, a top emission structure.

FIG. 2A is a plan view and FIG. 2B is a cross-sectional view taken along the line b-b of FIG. 2A.

In FIG. 2A, an element substrate 1 is made of glass, for example. A main surface of the element substrate 1 has a display region AR including a number of organic EL elements 2 which are disposed so as to be matrix-like.

Further, the main surface of the element substrate 1 has driver circuits 3 and 4 formed thereon. The driver circuits 3 and 4 are adjacent to the display region AR and drive the respective organic EL elements 2 independently.

The driver circuit 3 is formed as a circuit for sequentially selecting in a column direction (in a y direction in the figure) a group of a plurality of organic EL elements 2, the group of a plurality of organic EL elements 2 being among groups of a plurality of organic EL elements 2, each of the groups being in a row direction (in an x direction in the figure). The driver circuit 4 is formed as a circuit for supplying power to the respective organic EL elements 2 in the group of organic EL elements which are arranged in the row direction in synchronization with the timing of the selection by the driver circuit 3.

It is to be noted that the driver circuits 3 and 4 are formed, for example, in parallel with the formation of the organic EL elements 2 in the display region AR.

A specific structure of each organic EL element 2 is described in detail below, but each organic EL element 2 has an organic light-emitting layer (denoted as 211 in FIG. 3) between a lower electrode (denoted as 209 in FIG. 3) and an upper electrode (denoted as 212 in FIG. 3). The organic light-emitting layer is adapted to emit light according to current which flows as a result of the supply of the power described above.

On the other hand, a sealing substrate 5 is disposed so as to cover the display region AR and the driver circuits 3 and 4 formed on the main surface of the element substrate 1. The sealing substrate 5 is made of glass, for example.

A concave portion 6 is formed on a surface of the sealing substrate 5 opposed to the element substrate 1 and in the middle except the periphery thereof.

The sealing substrate 5 is firmly adhered to the element substrate 1 via a sealing material 8 formed on the surface of a protrusion 7 facing to element substrate 1 which is formed on the periphery of the sealing substrate 5. This makes the surface of the element substrate 1 having the display region AR and the driver circuits 3 and 4 formed thereon heremetically-sealed and firmly adhered by the sealing substrate 5 with space 9 formed therebetween.

A moisture absorbent 10 is formed in the concave portion 6 of the sealing substrate 5 so as not to overlap the display region AR when seen from a vertical direction. The moisture absorbent 10 absorbs moisture in the space 9 between the element substrate 1 and the sealing substrate 5. The moisture absorbent 10 makes it possible to avoid deterioration of the characteristics of the organic light-emitting layer of each organic EL element.

As illustrated in FIG. 2A, the moisture absorbent 10 is disposed on an outer periphery of the display region AR, and is formed so as to surround the display region AR.

The moisture absorbent 10 is formed so as to overlap regions where the driver circuits 3 and 4 are disposed. Therefore, the width of the moisture absorbent 10 formed so as to overlap the driver circuits 3 and 4 are larger than the width of the moisture absorbent 10 formed in other regions.

In view of the fact that the regions where the driver circuits 3 and 4 are formed do not contribute to image display, these regions are efficiently used to form a large amount of the moisture absorbent 10, thereby achieving stabilization of the characteristics of the organic EL elements 2.

In this case, the moisture absorbent 10 is adapted to be applied to the surface of the concave portion 6 of the sealing substrate 5 using, for example, a so-called dispenser. By discharging an application type moisture absorbent (a zeolite paste, a CaO paste, or the like) from a tip of a nozzle and moving the nozzle, the moisture absorbent is formed in a desired pattern. Therefore, the moisture absorbent 10 is formed in a linear pattern.

In side portions (side portions at the top and on the left in the figure) of the display region AR where the driver circuits 3 and 4 are not formed, the moisture absorbent 10 is formed so as to run in one direction in the side portions, while, in side portions (side portions at the bottom and on the right in the figure) of the display region AR where the driver circuits 3 and 4 are formed, the moisture absorbent 10 is formed so as to run in a meander manner reciprocating the side portions.

In this case, according to the present embodiment, in the side portions (the side portions at the bottom and on the right in the figure) of the display region AR where the driver circuits 3 and 4 are formed, the moisture absorbent 10 which is formed so as to run in a meander manner reciprocating the side portions is formed such that the moisture absorbent 10 in an approach route and the moisture absorbent 10 in a return route are not placed apart from each other but are joined to each other. More specifically, the moisture absorbent 10 in the linear pattern in the approach route and the moisture absorbent 10 in the linear pattern in the return route are formed so as to be in contact with each other at their sides opposed to each other. This is done in order to apply the moisture absorbent 10 as much as possible in a narrow region to achieve stabilization of the characteristics of the organic light-emitting layer of each organic EL element 2.

Further, in this embodiment, the moisture absorbent 10 is applied using, for example, a dispenser, and, in order to improve the temporal efficiency of the application, a so-called one stroke drawing is followed.

Figure 1A:
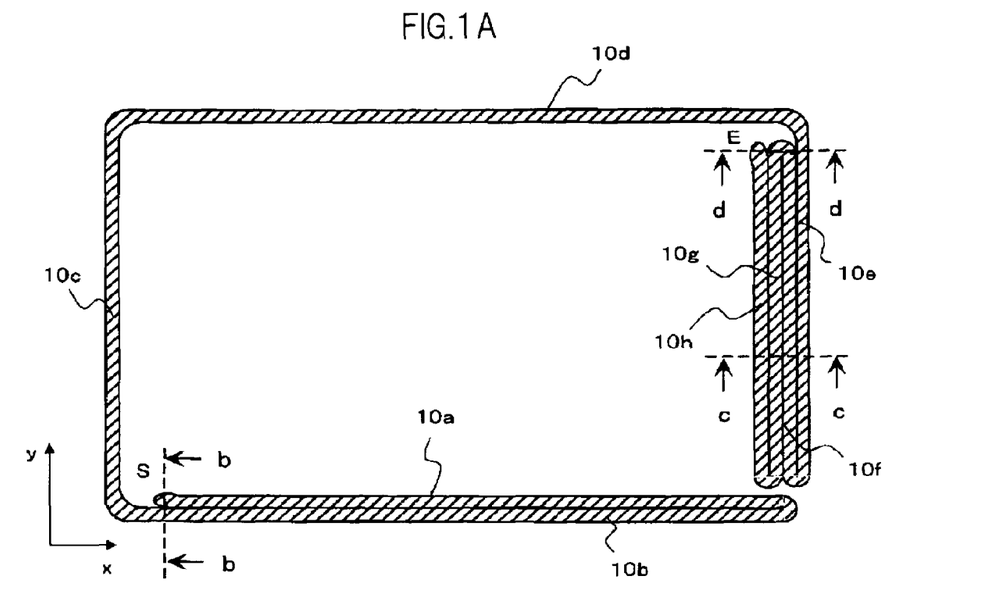
FIGS. 1A, 1B, 1C, and 1D each are partial structural views according to an embodiment of an organic EL display device of the present invention, and illustrate a pattern of a moisture absorbent.

For more specific description, FIG. 1A illustrates the moisture absorbent 10 taken out as it is from the organic EL display device illustrated in FIG. 2. Similarly to the one illustrated in FIG. 2, the moisture absorbent 10 is seen through the sealing substrate 5.

For example, the moisture absorbent 10 starts at a lower left corner of FIG. 1A (denoted as S in FIG. 1A), and extends in a +x direction. The extended portion (denoted as 10a) is at the bottom of the display region AR and extends slightly longer than the width of the display region AR.

The extended portion 10a in the +x direction of the moisture absorbent 10 changes its direction and then extends in a −x direction. In this case, an extended portion in the −x direction (denoted as 10b) is joined to the extended portion 10a in the +x direction without being apart therefrom.

This can make larger the width of the extended portion 10a in the +x direction and the extended portion 10b in the −x direction as the moisture absorbent 10 at the bottom of the display region AR. The extended portion 10a in the −x direction is formed so as to, for example, overlap the driver circuit 4. In this way, a region which does not contribute to display is efficiently used to dispose the moisture absorbent 10 therein.

The extended portion 10b in the −x direction changes its direction and then extends in a +y direction. The extended portion (denoted as 10c) is on the left of the display region AR and extends substantially the same length as the height of the display region AR.

The extended portion 10c in the +y direction of the moisture absorbent 10 changes its direction and then extends in the +x direction. The extended portion (denoted as 10d) is at the top of the display region AR and extends slightly longer than the width of the display region AR.

The extended portion 10d in the +x direction of the moisture absorbent 10 changes its direction and then extends in a −y direction. The extended portion (denoted as 10e) is on the right of the display region AR and extends slightly longer than the height of the display region AR.

The extended portions of the moisture absorbent 10 after that function to increase the width of the moisture absorbent 10 on the right of the display region AR in the display region AR side.

More specifically, the extended portion 10e in the −y direction of the moisture absorbent 10 changes its direction and then extends in the +y direction. The extended portion in the +y direction (denoted as 10f) is joined to the extended portion 10e in the −y direction without being apart therefrom. The extended portion 10e in the +y direction changes its direction and then extends in the −y direction. The extended portion in the −y direction (denoted as 10g) is joined to the extended portion 10f in the +y direction without being apart therefrom. The extended portion 10g in the −y direction changes its direction and then extends in the +y direction. The extended portion in the +y direction (denoted as 10h) is joined to the extended portion 10g in the −y direction without being apart therefrom, and reaches an end point (denoted as E).

Figure 1B:
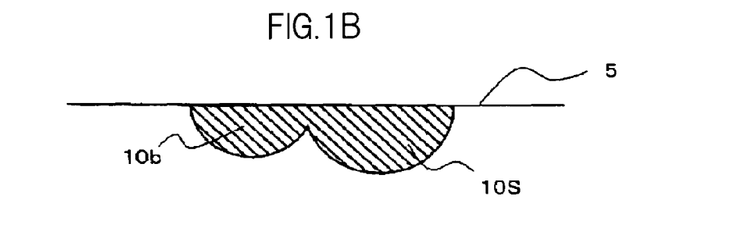

FIG. 1B is a cross-sectional view taken along the line b-b of FIG. 1A, and illustrates that the moisture absorbent (denoted as 10S) at a starting point S of the moisture absorbent 10a and the moisture absorbent 10b are disposed so as to be adjacent to and joined to each other.

Here, the moisture absorbent 10S at the starting point S is formed so as to be higher than the moisture absorbent 10b. Further, as illustrated in FIG. 1A, the width of the moisture absorbent 10S at the starting point S seen from the vertical direction is larger than that of the moisture absorbent other than the starting point S (the same can be said with regard to the end point E as described in detail in the following) such that the moisture absorbent 10S is bulging. The reason for this is that, because the discharge of the application type moisture absorbent from the tip of the nozzle can not be sharply started, a relatively large amount of the application type moisture absorbent is discharged.

Further, because the moisture absorbent 10S and the moisture absorbent 10b are formed so as not to be apart from each other, the crosssection is formed in the shape of two mounds joined to each other.

Figure 1C:
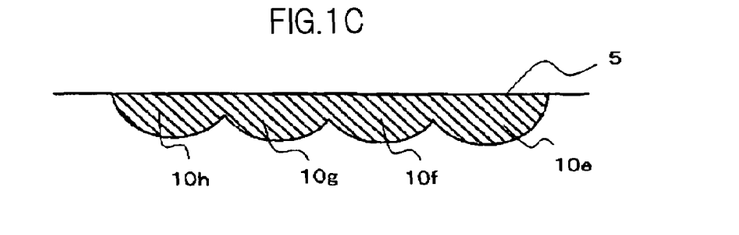

FIG. 1C is a cross-sectional view taken along the line c-c of FIG. 1A, and illustrates that the moisture absorbent 10e, the moisture absorbent 10f, the moisture absorbent 10g, and the moisture absorbent 10h are disposed so as to be adjacent to and joined to each other.

The moisture absorbent 10e, the moisture absorbent 10f, the moisture absorbent 10g, and the moisture absorbent 10h are formed so as to be substantially as high as one another, and the crosssection is formed in the shape of four mounds joined to one another.

Figure 1D:
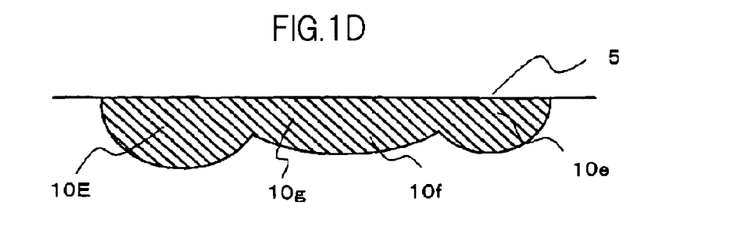

FIG. 1D is a cross-sectional view taken along the line d-d of FIG. 1A, and illustrates that the moisture absorbent at an end point E of the moisture absorbent 10h (denoted as 10E), the moisture absorbent 10g, the moisture absorbent 10f, and the moisture absorbent 10e are disposed so as to be adjacent to and joined to each other.

Here, the moisture absorbent 10E at the end point E is formed so as to be bulging, so as to be higher than the other moisture absorbents 10g, 10f, and 10e, and, as illustrated in FIG. 1A, such that the width thereof seen from the vertical direction is larger.

The reason for this is that, similarly to the case of the moisture absorbent 10 at the starting point S, because the discharge of the application type moisture absorbent from the tip of the nozzle can not be sharply stopped, a relatively large amount of the application type moisture absorbent is discharged.

It is to be noted that the moisture absorbent 10 is cured by, after applying the application type moisture absorbent as described above, temporarily drying and then being baked. When a zeolite paste is used as the application type moisture absorbent, the temporary drying is carried out at 120° C. for 30 minutes (in the air) and the baking is carried out at 300-400° C. for 60 minutes (in the air), and after that, heating is carried out in dry $N_2$ at 300-400° C. for 60 minutes to remove the moisture therein.

The time period between the application and the temporary drying of the application type moisture absorbent is preferably as short as possible. The reason is that the application type moisture absorbent may be cured with its shape maintained as it is, that is, without going limp, and thus, the width, the height, and the like of the moisture absorbent may be easily controlled.

With regard to the pattern of the application of the moisture absorbent 10, for example, the width is 100-1000 μm, the height is 50-300 μm, and the radius of the rounded corners is 0.5-1 mm.

Figure 3:
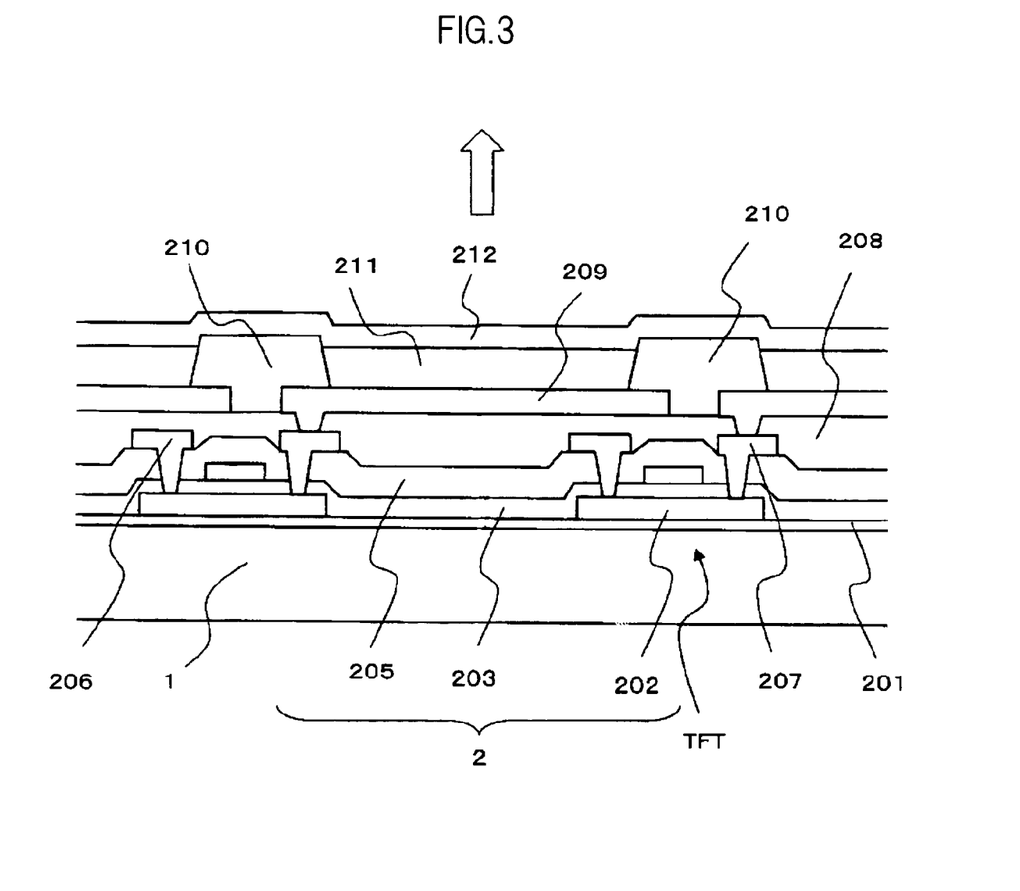
FIG. 3 is a cross-sectional view according to an embodiment of an organic EL element of the organic EL display device of the present invention.

FIG. 3 is a cross-sectional view of an embodiment of the organic EL element 2 formed in the display region AR.

First, an underlayer film 201 is formed on the element substrate 1. An island-like semiconductor layer 202 is formed on the surface of the underlayer film 201. The semiconductor layer 202 is a semiconductor layer of a so-called thin film transistor TFT, and may be formed by, for example, forming an amorphous silicon layer, modifying the amorphous silicon into polysilicon by excimer laser irradiation, and patterning the polysilicon.

An insulating film 203 is formed on the surface of the underlayer film 201 so as to also cover the semiconductor layer 202. The insulating film 203 is to function as a gate insulating film in a region where the thin film transistor TFT is formed.

Further, a gate electrode 204 is formed on the surface of the insulating film 203 so as to run over the substantial center of the semiconductor layer 202. When a picture signal is input, a potential according to the picture signal is applied to the gate electrode 204 (not shown).

An interlayer insulating film 205 is formed on the surface of the insulating film 203 so as to also cover the gate electrode 204.

A drain electrode 206 and a source electrode 207 are formed on the surface of the interlayer insulating film 205. The drain electrode 206 and the source electrode 207 are electrically connected to a drain region and a source region, respectively, of the semiconductor layer 202 of the thin film transistor TFT via through holes formed in the interlayer insulating film 205 and the insulating film 203. The drain electrode 206 (not shown) is connected to a power supply line for supplying power to an organic light-emitting layer 211 described in the following.

A drain electrode and a source electrode of a thin film transistor TFT are reversed depending on the applying condition of bias. However, in this specification, for the sake of convenience, the electrode which is connected to the power supply line is referred to as the drain electrode.

A passivation film 208 is formed on the surface of the interlayer insulating film 205 so as to cover the drain electrode 206 and the source electrode 207. The passivation film 208 may be planarized by using, for example, a resin as its material.

A lower electrode 209 is formed on the surface of the passivation film 208. Part of the lower electrode 209 is electrically connected to the source electrode 207 of the thin film transistor TFT via a through hole formed in the passivation film 208.

The lower electrode 209 is formed in the whole area of a middle portion of the display region AR, that is, the whole area except the periphery of a picture element (pixel) region.

A pixel separation film 210 is formed on a surface of the passivation film 208 which is not covered with the lower electrodes 209 so as to overlap the periphery of the lower electrode 209.

In this way, the pixel separation film 210 is formed in a ring-like pattern so as to partition the respective adjacent picture element (pixel) regions. The lower electrode 209 is adapted to be exposed at an aperture in the pixel separation film 210.

The organic light-emitting layer 211 is formed on the surface of the lower electrode 209. The organic light-emitting layer 211 is formed so as to be physically separated from the organic light-emitting layer 211 of another adjacent organic EL element 2 by the pixel separation film 210.

An upper electrode 212 which is a transparent conductive film made of, for example, Indium Tin Oxide (ITO) is formed on the surface of the organic light-emitting layer 211 so as to also cover the pixel separation film 210. The upper electrode 212 is common to each of the organic EL elements 2, and a reference potential in relation to a potential applied to the lower electrode 209 is applied to the upper electrode 212.

In the organic EL elements 2 having the above-mentioned structure, by passing current through the organic light-emitting layer 211 according to voltages applied to the lower electrode 209 and the upper electrode 212, the organic light-emitting layer 211 emits light.

The light emitted from the organic light-emitting layer 211 is irradiated through the upper electrode 212 which is formed of a transparent conductive film to an upper side (in a direction indicated by an arrow) of FIG. 3, which is a reason that the structure is referred to as a top emission structure.

Embodiment 2

Figure 4:
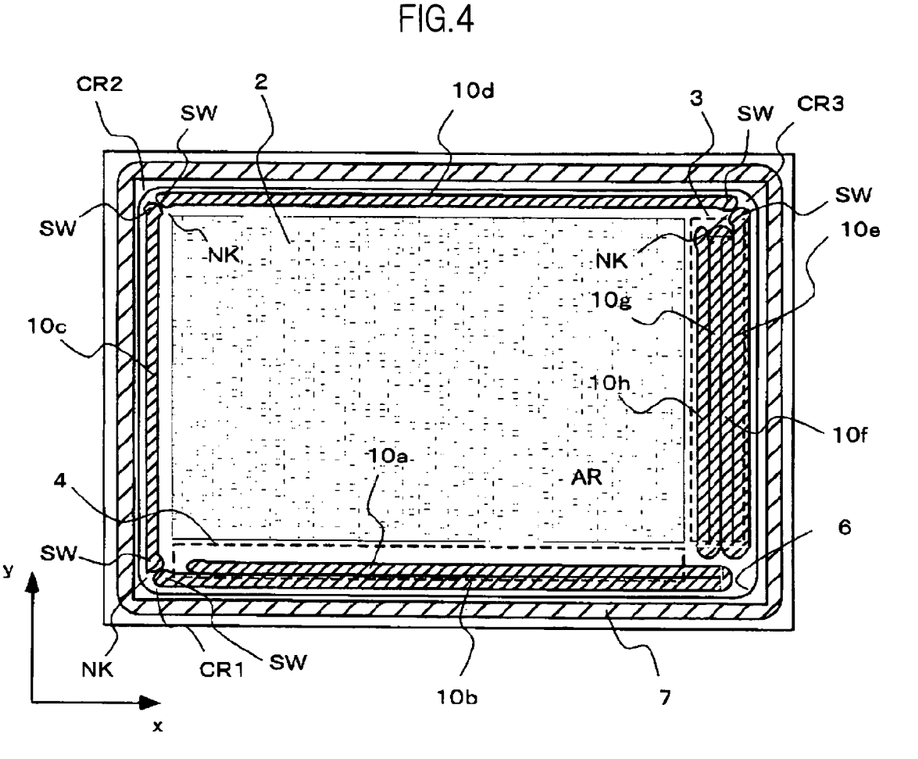
FIG. 4 is a structural view according to another embodiment of the organic EL display device of the present invention.

FIG. 4 illustrates another embodiment of the organic EL display device according to the present invention, and corresponds to FIG. 2A.

The structure illustrated in FIG. 4 differs from the structure illustrated in FIG. 2A in that the moisture absorbent 10 formed so as to surround the display region AR is formed so as to have a constriction in, for example, corner portions and so as to have bulging portions where the width is larger on both sides of the constriction.

More specifically, in FIG. 4, the moisture absorbent 10b formed so as to extend, for example, in the −x direction and the moisture absorbent 10c formed so as to extend, for example, in the +y direction have a constriction NK in a corner portion CR1 which is the point where the moisture absorbent changes its direction, and have bulging portions SW where the width is larger on both sides of the constriction NK.

Further, the moisture absorbent 10c and the moisture absorbent 10d formed so as to extend, for example, in the +x direction have a constriction NK in a corner portion CR2 which is the point where the moisture absorbent changes its direction, and have bulging portions SW where the width is larger on both sides of the constriction NK.

Still further, the moisture absorbent 10d and the moisture absorbent 10e formed so as to extend, for example, in the −y direction have a constriction NK in a corner portion CR3 which is the point where the moisture absorbent changes its direction, and have bulging portions SW where the width is larger on both sides of the constriction NK.

The moisture absorbent 10 is formed by, when the application type moisture absorbent is applied while the dispenser is moved, temporarily stopping the application when the dispenser comes to a corner portion, changing the direction of the movement, and then restarting the application. Unlike the case illustrated in FIG. 2A in which the application is carried out by one stroke drawing using a dispenser, the application is paused when the dispenser comes to a corner portion.

More specifically, at an end portion of the moisture absorbent before a pause of the application, because the discharge from the tip of the nozzle of the dispenser of the application type moisture absorbent can not be sharply stopped, a relatively large amount of the application type moisture absorbent is discharged, and thus, a bulge having a large width is formed. At an end portion of the moisture absorbent after the pause of the application, from a reason similar to the above, a bulge having a large width is formed. By bringing the bulges into contact with each other, the constriction is generated.

In some cases, the bulges of the moisture absorbents are formed without being brought into contact with each other, but, even in such cases, a slight gap therebetween may be regarded as equivalence to the constriction.

It is to be noted that, in FIG. 4, the moisture absorbent 10 formed by reciprocation of the moisture absorbents 10a and 10b or of the moisture absorbents 10e, 10f, 10g, and 10h is formed such that the moisture absorbent 10 in the linear pattern in the approach route and the moisture absorbent 10 in the linear pattern in the return route are formed so as to be in contact with each other at their sides opposed to each other, which is similar to that illustrated in FIG. 2A.

Embodiment 3

Figure 5A:
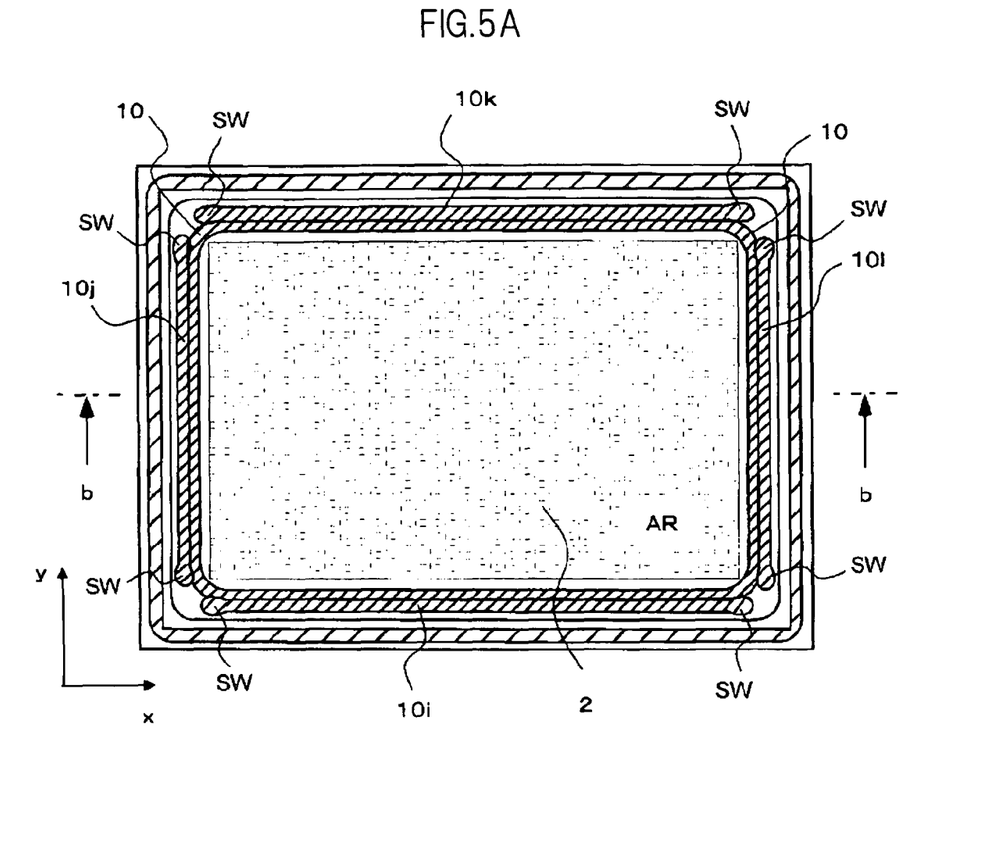
FIGS. 5A and 5B each are structural views of still another embodiment according to the organic EL display device of the present invention.

FIG. 5A illustrates still another embodiment of the organic EL display device according to the present invention and corresponds to FIG. 2A.

The structure illustrated in FIG. 5A differs from the structure illustrated in FIG. 2A in that, first, the driver circuits 3 and 4 are not formed on the surface of the whole element substrate 1.

Second, the moisture absorbent 10 is formed in a ring-like pattern so as to surround the display region AR, and is disposed so as to be slightly spaced apart from the periphery of the display region AR.

Third, moisture absorbents 10i, 10j, 10k, and 10l are disposed outside the moisture absorbent 10 except the corner portions (having a curvature) of the moisture absorbent 10.

The moisture absorbent 10i is joined to the moisture absorbent 10 along its length on the side of the moisture absorbent 10, the moisture absorbent 10j is joined to the moisture absorbent 10 along its length on the side of the moisture absorbent 10, the moisture absorbent 10k is joined to the moisture absorbent 10 along its length on the side of the moisture absorbent 10, and the moisture absorbent 10l is joined to the moisture absorbent 10 along its length on the side of the moisture absorbent 10.

Figure 5B:
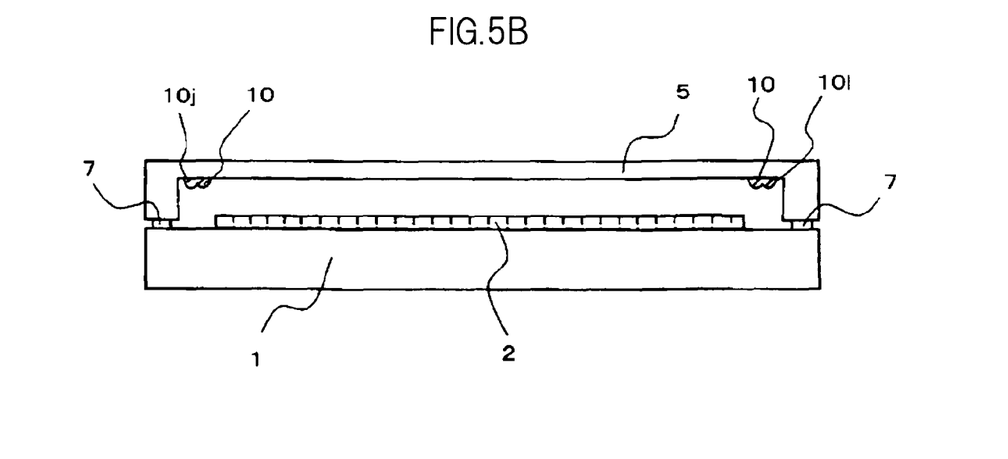

FIG. 5B is a cross-sectional view taken along the line b-b of FIG. 5A. As is clear from FIG. 5B, the moisture absorbent 10 and the moisture absorbent 10j and the moisture absorbent 10 and the moisture absorbent 10l are formed so as not to be apart from each other, and thus, the crosssections thereof are formed in the shape of two mounds joined to each other.

Although not shown in the figures, in a similar way, the crosssections of the moisture absorbent 10 and the moisture absorbent 10i, and the moisture absorbent 10 and the moisture absorbent 10k are formed in the shape of two mounds joined to each other.

Further, the moisture absorbents 10i, 10j, 10k, and 10l are formed in a linear pattern having two end portions, respectively, and a bulging portion SW where the width is larger is formed at each of the end portions. As described above, this is because the discharge from the tip of the nozzle of the dispenser of the application type moisture absorbent can not be sharply started/stopped to discharge a relatively large amount of the application type moisture absorbent.

By disposing the moisture absorbents 10i, 10j, 10k, and 10l in this way, compared with a case in which only the moisture absorbent 10 is disposed, a larger amount of the moisture absorbent 10 may be disposed without increasing the width more than necessary.

Therefore, stabilization of the characteristics of the organic light-emitting layer 211 may be achieved, and a so-called frame (a region between the periphery of the display region AR and the periphery of the element substrate 1) may be prevented from becoming large.

Such a structure is effective in the case where the element substrate 1 does not have a driver circuit formed thereon, because, in the case, it is difficult to secure a region where a large amount of the moisture absorbent 10 may be formed.

Embodiment 4

Figure 6:
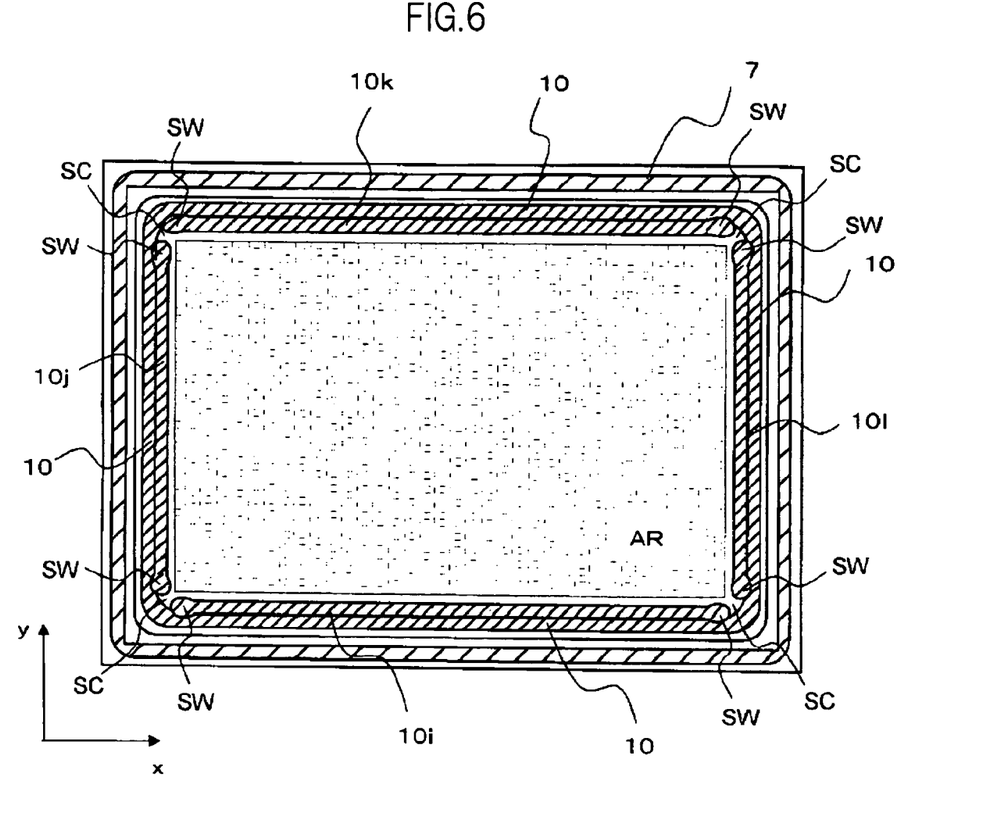
FIG. 6 is a structural view according to yet another embodiment of the organic EL display device of the present invention.

FIG. 6 illustrates yet another embodiment of the organic EL display device according to the present invention, and corresponds to FIG. 5A.

The structure illustrated in FIG. 6 differs from the structure illustrated in FIG. 5A in that the moisture absorbents 10i, 10j, 10k, and 10l formed so as to be joined to the moisture absorbent 10 are disposed inside the moisture absorbent 10.

Similarly to the case illustrated in FIG. 5A, in the moisture absorbents 10i, 10j, 10k, and 10l, separation portions between the moisture absorbents disposed so as to be orthogonal to and next to each other are located in the corner portions (having a curvature) of the moisture absorbent 10.

The moisture absorbents 10, 10i, 10j, 10k, and 10l formed so as to surround the display region AR are formed in a pattern having corner portions whose inside portions are scooped toward the outside (denoted as SC in the figure).

This has an effect that the corner portions of the display region AR may be positioned at the portions which are scooped toward the outside of the moisture absorbents 10, 10i, 10j, 10k, and 10l and, the moisture absorbents 10i, 10j, 10k, and 10l, and further, the moisture absorbent 10, may be disposed in the vicinity of the periphery of the display region AR.

A layer structure and materials of the organic EL elements 2 are described in the following.

The organic EL element 2 of a top emission type includes the upper electrode 212 which is transparent to visible radiation range, the organic light-emitting layer 211, and the light reflective lower electrode 209.

There are a structure in which the lower electrode 209 is a cathode and the upper electrode 212 is an anode, and a structure in which the lower electrode 209 is an anode and the upper electrode 212 is a cathode. In either of the two cases, a material which is highly transparent to visible radiation is used for the upper electrode 212. A preferable material has a transmittance of 80% or more (preferably 90% or more) with regard to the whole visible radiation range.

In a structure in which the lower electrode 209 is a cathode and the upper electrode 212 is an anode, lamination is carried out in the order of the lower electrode, a hole injection layer, a hole transportation layer, the light-emitting layer, an electron transportation layer, an electron injection layer, and the upper electrode. In a structure in which the lower electrode 209 is an anode and the upper electrode 212 is a cathode, lamination is carried out in the order of the lower electrode, an electron injection layer, an electron transportation layer, the light-emitting layer, a hole transportation layer, a hole injection layer, and the upper electrode.

It is to be noted that, in the above-mentioned structure, the electron injection layer or the hole injection layer may be omitted, and the electron transportation layer or the hole transportation layer may be omitted.

When the lower electrode 209 is a cathode and the upper electrode 212 is an anode, a conductive film material having a small work function for enhancing electron injection efficiency is preferably used for the lower electrode 209. More specifically, aluminum, an aluminum-neodymium alloy, a magnesium-silver alloy, or the like may be used. A transparent conductive film which is an oxide the main material of which is indium oxide such as Indium Tin Oxide (ITO) or Indium Zinc Oxide (IZO) is preferably used for the upper electrode 212.

The electrodes 209 and 212 are formed by sputtering method, EB deposition method, ion plating method, or the like.

On the other hand, when the lower electrode 209 is an anode and the upper electrode 212 is a cathode, materials similar to the above are used for the anode and the cathode, but it is necessary that the cathode of the upper electrode 212 have translucency.

When a conductive film material having a small work function such as a metal material is used, its thickness is reduced until its transmittance with regard to visible radiation is at least 80%. The film thickness is, for example, 15 nm or less. Alternatively, a structure in which a transparent conductive film material is laminated on a conductive film material such as a metal material may be used.

The electron injection layer may be formed of lithium fluoride, magnesium fluoride, calcium fluoride, strontium fluoride, barium fluoride, magnesium oxide, aluminum oxide, or the like, and is formed by vacuum deposition method or the like.

The electron transportation layer may be formed of tris (8-quinolinol) aluminum, an oxadiazole derivative, a silole derivative, a zinc benzothiazole complex, or the like, and is formed by vacuum deposition method or the like.

With regard to the organic light-emitting layer 211, a host material thereof itself may emit light, or a small amount of a dopant material added to a host material thereof may emit light.

As the host material, there are given a distyryl arylene derivative (DPVBi), a silole derivative (2PSP) having a benzene ring in the skeleton, an oxadiazole derivative (EM2) having a triphenyl amine structure in both ends of the molecule, a perinone derivative (P1) having a phenanthrene group, an oligothiophene derivative (BMA-3T) having a triphenylamine structure in both ends of the molecule, a perylene derivative (tBu-PTC), tris(8-quinolinol)aluminum, a polyparaphenylene vinylene derivative, a polythiophene derivative, a polyparaphenylene derivative, a polysilane derivative, a polyacetylene derivative, and the like.

In addition, as a material of the dopant, there are given quinacridone, coumarin 6, nile red, rubrene, 4-(dicyanomethylene)-2-methyl-6-(paradimethylaminostyryl)-4H-pyran (DCM), a dicarbazole derivative, and the like. The dopant may be formed by a vacuum deposition method, a co-deposition method, or the like.

As the material of the hole-transporting layer, there are given
N,N'-bis(3-methylphenyl)-N,N'-diphenyl-[1,1'-biphenyl]-4, 4' diamine (TPD), 4,4'-bis[N-(1-naphthyl)-N-phenylamino] biphenyl (α-NPD), 4,4',4"-tri(N-carbazolyl)triphenylamine (TCTA), 1,3,5-tris[4-diphenylaminophenyl]benzene (p-DPA-TDAB), and the like. The hole-transporting layer may be formed by a vacuum deposition method or the like.

As the material of the hole-injecting layer, there are given steel phthalocyanine, a starburst amine compound, polyaniline, polythiophene, and the like. The hole-injecting layer may be formed by a vacuum deposition method or the like.

With regard to the method of forming the respective layers of the organic light-emitting layer 211, vacuum deposition method or the like is used in the formation when a single material is used, while co-deposition or the like is used in the formation when a plurality of materials are used.

Although a case in which zeolite or CaO is used as the moisture absorbent 10 is described in the above, particles of a chemically hygroscopic material, a metal complex compound, or particles of a physically adsorptive material may also be used. Further, a photocurable resin or the like may be used for the sealing material 8.

An organic EL display device according to the present invention may be mounted on any electronic appliance having a monitor for displaying an image such as a monitor for checking an image captured by a digital camera, a digital video camera, a cellular phone, and a personal computer.

It is to be noted that the present invention is not limited to the embodiments described in the above, and it goes without saying that various modifications are possible within the technical idea of the present invention.

Further, the embodiments described in the above may be used alone or may be used in combination, because effects of the respective embodiments may be enjoyed alone or synergistically.

What is claimed is:

1. An organic electroluminescence display device comprising:
    a rectangle element substrate having a display region with a plurality of light-emitting elements being arranged therein; and
    a sealing substrate firmly adhered to the element substrate with a sealing material at a protrusion formed on the periphery thereof and opposed to the element substrate, wherein
    a moisture absorbent is formed in a region of a concave surface surrounded by the protrusion of the sealing substrate so as not to overlap the display region, and
    the moisture absorbent includes moisture absorbents which are formed of a plurality of linear pattern set each joined to adjacent moisture absorbents so as to be disposed in parallel with each other, and the cross sections of the moisture absorbents intersecting the longitudinal direction of the moisture absorbents are formed in a shape of continuous convexes joined to each other.

2. An organic electroluminescence display device according to claim 1, wherein the moisture absorbents which are formed of the plurality of linear pattern set each joined to adjacent moisture absorbents so as to be disposed in parallel with each other are formed by changing a direction of an extended portion of a moisture absorbent extending in one direction and then extending another moisture absorbent in a direction opposite to the one direction so that the moisture absorbent in the linear pattern in the approach route and the moisture absorbent in the linear pattern in the return route are formed so as to be in contact with each other at their sides opposed to each other.

3. An organic electroluminescence display device according to claim 1, wherein
    a driver circuit for driving the light-emitting elements is formed on the element substrate adjacent to the display region, and
    the moisture absorbents which are formed of the plurality of linear pattern set each joined to adjacent another moisture absorbents so as to be disposed in parallel with each other are formed so as to overlap at least a part of the driver circuit.

4. An organic electroluminescence display device according to claim 3, wherein the moisture absorbent is formed so as to surround the display region and the driver circuit.

5. An organic electroluminescence display device according to claim 1, wherein the moisture absorbents which are formed of the plurality of linear pattern set each joined to adjacent another moisture absorbents so as to be disposed in parallel with each other comprise a ring-like moisture absorbent formed so as to surround the display region.

6. An organic electroluminescence display device according to claim 5, wherein the ring-like moisture absorbent located innermost surrounds the display region seamlessly, the other moisture absorbents located on the outside of said ring-like moisture absorbent located innermost are disposed except corner portions of the ring-like moisture absorbent located innermost.

\* \* \* \* \*